United States Patent
Lee et al.

(10) Patent No.: US 11,357,137 B2
(45) Date of Patent: Jun. 7, 2022

(54) ONE-CHAMBERED CONSTANT PRESSURE APPARATUS FOR LIQUID IMMERSION COOLING OF SERVERS

(71) Applicants: Fang-Shou Lee, Taoyuan (TW); Cho-Han Lee, Taoyuan (TW)

(72) Inventors: Fang-Shou Lee, Taoyuan (TW); Cho-Han Lee, Taoyuan (TW); Fang Wang, Livermore, CA (US)

(73) Assignees: Fang-Shou Lee, Taoyuan (TW); Cho-Han Lee, Taoyuan (TW)

( * ) Notice: Subject to any disclaimer, the term of this patent is extended or adjusted under 35 U.S.C. 154(b) by 0 days.

(21) Appl. No.: 17/329,184

(22) Filed: May 25, 2021

(65) Prior Publication Data
US 2022/0007548 A1 Jan. 6, 2022

(30) Foreign Application Priority Data
Jul. 2, 2020 (TW) .................... 109122392

(51) Int. Cl.
*H05K 7/20* (2006.01)
(52) U.S. Cl.
CPC ................ *H05K 7/20818* (2013.01)
(58) Field of Classification Search
CPC ... H05K 7/20818; H05K 7/203; F24F 1/0063; F28F 1/16
See application file for complete search history.

(56) References Cited

U.S. PATENT DOCUMENTS

| | | | | |
|---|---|---|---|---|
| 3,858,090 A | * | 12/1974 | Lehmann | H05K 7/20236 361/689 |
| 4,619,316 A | * | 10/1986 | Nakayama | F28F 13/187 257/713 |
| 8,953,317 B2 | * | 2/2015 | Campbell | F28D 1/0477 361/689 |

(Continued)

FOREIGN PATENT DOCUMENTS

| CN | 204272576 U | * | 4/2015 |
|---|---|---|---|
| CN | 204272576 U | | 4/2015 |

(Continued)

*Primary Examiner* — Abhishek M Rathod

(57) ABSTRACT

The present invention discloses a one-chambered constant pressure apparatus for liquid immersion cooling of servers, which are submerged within a non-conductive coolant maintained in the apparatus. When servers start to operate, a large amount of heat will be dissipated from servers. The coolant is vaporized into a coolant vapor by absorbing heat dissipated from servers, which enables servers to be cooled. The coolant vapor is condensed into a cooling liquid by a condenser. However, in the process of condensation, the rising coolant vapor tends to scatter in all directions resulting in a failure to condense all of the coolant vapor. Therefore, the uncondensed coolant vapor will cause the pressure in the apparatus to gradually rise, which eventually leads to the ineffective cooling of servers. In view of this problem, the disclosed invention provides an enclosed-type condenser for completely condensing all of the coolant vapor, thereby maintaining the constant pressure in the apparatus and ensuring the reliability of the apparatus during operation and the sustainability of the cooling capacity thereof.

5 Claims, 2 Drawing Sheets

(56) References Cited

U.S. PATENT DOCUMENTS

| | | | |
|---|---|---|---|
| 9,328,964 B2 * | 5/2016 | Shelnutt | H05K 7/20818 |
| 9,464,854 B2 * | 10/2016 | Shelnutt | H05K 7/20281 |
| 9,560,789 B2 * | 1/2017 | Smith | G06F 1/20 |
| 9,844,166 B2 | 12/2017 | Shelnutt et al. | |
| 10,512,192 B2 | 12/2019 | Miyoshi | |
| 2013/0288591 A1 * | 10/2013 | Yang | F24F 13/222 |
| | | | 454/284 |
| 2014/0218861 A1 * | 8/2014 | Shelnutt | H05K 7/20818 |
| | | | 361/679.53 |

FOREIGN PATENT DOCUMENTS

| | | | | |
|---|---|---|---|---|
| CN | 107045380 A | * | 8/2017 | |
| CN | 107045380 A | | 8/2017 | |
| CN | 107066056 A | * | 8/2017 | |
| CN | 107066056 A | | 8/2017 | |
| EP | 2665349 A1 | * | 11/2013 | H05K 7/20236 |
| EP | 2665349 B1 | | 11/2013 | |

\* cited by examiner

ONE-CHAMBERED CONSTANT PRESSURE APPARATUS FOR LIQUID IMMERSION COOLING OF SERVERS

CROSS-REFERENCE TO RELATED APPLICATION

This application claims priority to an earlier Taiwan patent application Ser. No. 109122392, filed Jul. 2, 2020, which is incorporated herein by reference in its entirety.

BACKGROUND OF THE INVENTION

Field of Invention

The present invention relates to an apparatus for liquid immersion cooling of servers. More particularly, this present invention relates to a one-chambered constant pressure apparatus for liquid immersion cooling of servers.

Description of the Related Art

In the past half century, most data centers have used elevated floors for pressurized air passing thereunder to achieve a cooling effect. For example, computer room air conditioning (CRAC) units or computer room air handler (CRAH) units are often used to cool data centers by a constant speed fan supplying cooling air. When small numbers of server cabinets are located in a data center, such types of air cooling systems can still work well in terms of cooling; however, said air cooling systems are clearly not effective and sufficient to meet requirements for heat dissipation in a data center where large numbers of server cabinets are present. In addition, traditional air cooling systems are indirect contact-type cooling ones. Said air cooling systems have such shortcomings as complicated heat transfer process, thermal contact resistance and convective thermal resistance, which cause low heat transfer efficiency and large temperature differences between low and high temperature heat sources during the heat transfer. In addition to the air cooling, a liquid cooling technique has also been applied for the purpose of cooling server cabinets. The liquid cooling technique basically uses working fluid as a heat transfer medium to transfer heat from a heat-generating device to a cooling device. Based on the fact that the specific heat of liquid is higher than that of air, and the heat dissipation rate of liquid is also much larger than that of air, the liquid cooling therefore has higher cooling efficiency than the air cooling.

However, with the advent of the data age, people are increasingly pursuing the pinnacle of science and technology, and the ultimate in efficiency. The conventional cooling techniques such as air cooling and liquid cooling have been unable to meet the excess demand for the cooling of servers. In response to this demand, a phase-change liquid immersion cooling system has been developed in recent years. The liquid immersion cooling system uses a non-conductive coolant to absorb a heat load of a server, and then transforms it to a coolant vapor, which is sequentially condensed to a liquid phase by a condensing device. In terms of thermal principles, an evaporative cooling is a process in which a heat load is removed by the latent heat of vaporization occurring when a non-conductive coolant absorbs heat and then evaporates. Since the latent heat of vaporized liquid is much larger than the specific heat of liquid, the evaporative cooling has a more significant effect on the cooling than the liquid cooling.

Nowadays, as far as the phase-change liquid immersion cooling technology is concerned, a condensing device is often positioned above the surface of a coolant in order to condense the vapor phase of the coolant to the liquid phase, which can be returned to a coolant-containing tank. However, when the coolant is vaporized into the coolant vapor by absorbing heat dissipated from servers, the rising coolant vapor will scatter in all directions, causing a portion of the coolant vapor to flow upward through the condensing device. Therefore, the condensing device cannot condense all of the rising coolant vapor, which in turn causes the uncondensed coolant vapor to gradually accumulate in the coolant-containing tank.

Moreover, the system pressure plays a very important role in the efficient and timely condensing of a phase-change liquid immersion cooling system. In other words, the boiling point temperature of a coolant is closely associated with the system pressure in a phase-change liquid immersion cooling system. When the system pressure gets higher, the boiling point temperature of the coolant turns to be higher as well. As a result, once the condensing device doesn't have sufficient cooling capacity, the vapor phase of the coolant cannot be condensed completely enough to prevent the system pressure from getting higher, which causes the boiling point temperature of the coolant to rise and the failure to meet the requirement for the timely cooling of a server. When the server starts to operate, the coolant is heated to a boiling point temperature generating the coolant vapor and then the pressure in the phase-change liquid immersion cooling system rises accordingly, which leads to the internal temperature of the liquid cooling system to rise.

For the time being, the common solution to the aforementioned problem is that a pressure relief valve is mounted on the housing of the liquid cooling system. When the system pressure reaches a preset threshold, the pressure relief valve relieves the pressure. However, in most cases where a joint or a valve is used as a means to relieve the pressure, there is frictional resistance between the housing of the liquid cooling system and such connecting components as joints and valves. In the event that the pressure in the liquid cooling system is not high enough to overcome frictional resistance of the connecting components, the coolant vapor cannot be evacuated to the ambient environment in time. When the rate of production of the coolant vapor is higher than that of evacuation, the internal pressure in the liquid cooling system will rise, which eventually causes serious unintended consequences for servers. In view of this, in an attempt to ensure the reliability of the liquid immersion cooling system and the sustainability of cooling capacity thereof, it is necessary to develop a novel liquid immersion cooling system, which is well maintained at a constant pressure during operation.

BRIEF SUMMARY OF THE INVENTION

The object of the present invention is to provide a one-chambered constant pressure apparatus for liquid immersion cooling of servers. The disclosed apparatus has an enclosed-type condensing device. During the operation of servers, a coolant is heated to a boiling point temperature by absorbing heat dissipated from the servers, and then generates a coolant vapor, which rises from a surface level of the coolant. The enclosed-type condensing device can completely condense all of the rising coolant vapor by preventing the rising coolant vapor from passing through condensing components, thereby maintaining the constant pressure in the apparatus and ensuring the reliability of the apparatus during operation and the sustainability of the cooling capacity thereof.

In order to attain the aforesaid object, according to one embodiment, a one-chambered constant pressure apparatus for liquid immersion cooling of servers comprises a chassis, a working fluid maintained within the chassis, a plurality of servers, and a condensing device.

The working fluid is maintained within the chassis. The plurality of servers are submerged within the working fluid. The condensing device is disposed above a surface level of the working fluid. The condensing device comprises a fluid inlet manifold, a fluid outlet manifold and the same number of openable and closeable condensing components as the servers, wherein each of the condensing components comprises two condensing plates that are symmetrical and inclined to each other, the two condensing plates are located above each of the servers, upper sections of the two condensing plates are mutually inclined closed, each of the two condensing plates has a fluid passage disposed in a lower section thereof, a fluid inlet port of the fluid passage communicates with the fluid inlet manifold, a fluid outlet port of the fluid passage communicates with the fluid outlet manifold.

In one or more embodiments, wherein the working fluid is a non-conductive coolant.

In one or more embodiments, wherein the working fluid has a boiling point temperature ranging from 30° C. to 60° C.

In one or more embodiments, the apparatus further comprises an external condenser.

In one or more embodiments, wherein the external condenser is connected to a conduit, one end of the conduit is disposed on the top of the chassis, the other end of the conduit is disposed on a side wall of the chassis between the condensing device and the surface level of the working fluid.

As aforementioned, the present invention discloses a novel apparatus for liquid immersion cooling of servers, characterized in that an enclosed-type condensing device is provided in the apparatus. In contrast, conventional condensing devices of the immersion cooling apparatus are disposed in an open-type manner above the surface level of a coolant. In cases where conventional condensing devices are open-type ones, when servers start to operate, the coolant is vaporized into a coolant vapor by absorbing heat dissipated from servers. The coolant vapor rises from the surface level of the coolant and scatters in all directions; therefore, a portion of the rising coolant vapor unavoidably passes through the open-type condensing devices without being condensed. The uncondensed coolant vapor gradually accumulates in the apparatus, eventually causing the pressure in the apparatus to rise. In view of this problem, the present immersion cooling apparatus provides a condensing device with a special structural design, which comprises a plurality of condensing components having two condensing plates. Upper sections of the two condensing plates are mutually inclined closed to form an inverted V-shaped arrangement. Each of the two condensing plates has a fluid passage disposed in the lower section thereof. A fluid inlet port of the fluid passage communicates with a fluid inlet manifold, and a fluid outlet port of the fluid passage communicates with a fluid outlet manifold. A condensation fluid is allowed to enter through the fluid passage from the fluid inlet port and then exit from fluid outlet port. When the coolant is vaporized into the coolant vapor by absorbing heat dissipated from servers, the coolant vapor rises from the surface level of the coolant and then is condensed into a coolant liquid upon contact with or exposure to the two mutually inclined closed condensing plates located above the surface level of the coolant. By doing so, all of the rising coolant vapor is completely condensed without passing through the condensing components, thereby maintaining the constant pressure in the apparatus and ensuring the reliability of the apparatus during operation and the sustainability of the cooling capacity thereof.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

Figure 1:
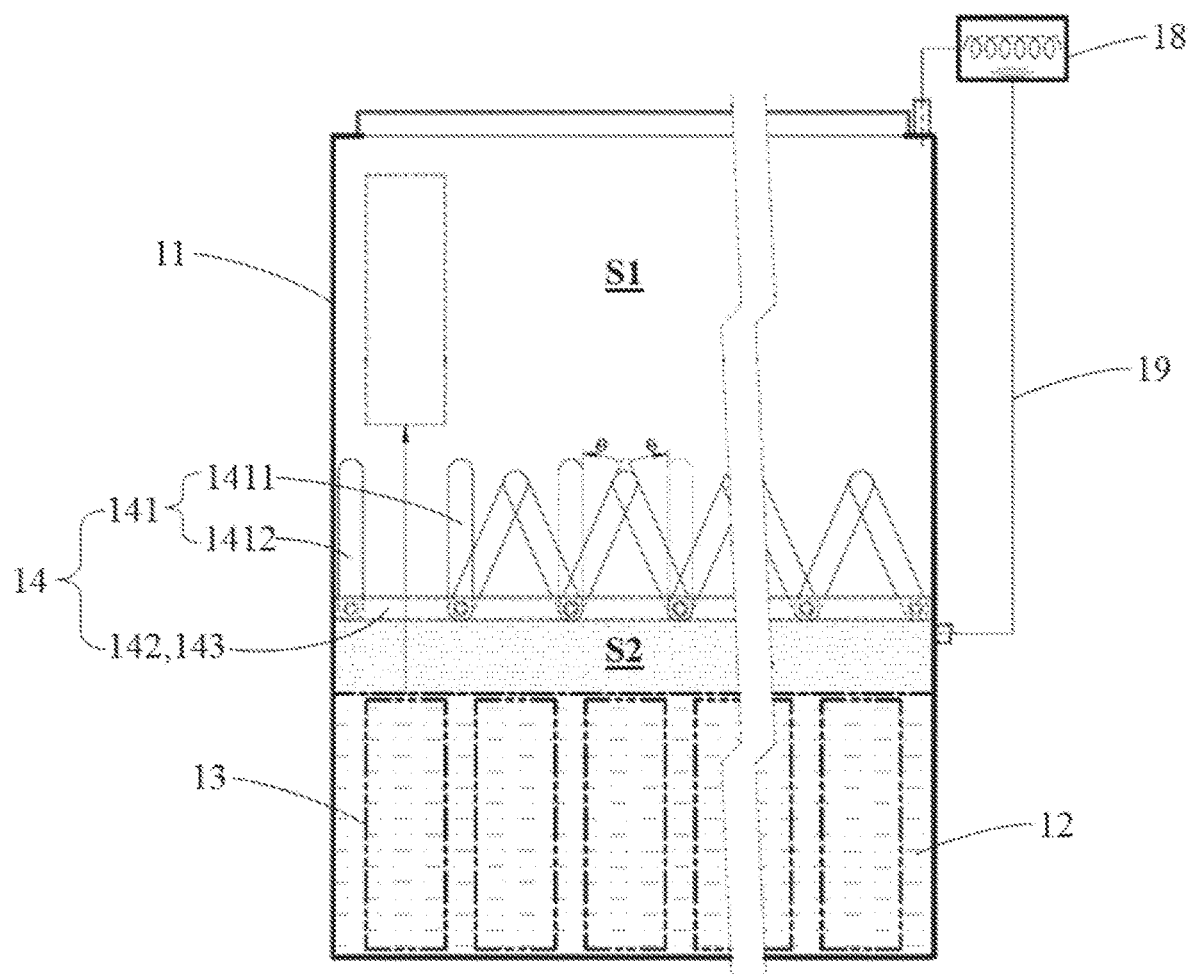
FIG. 1 is a schematic diagram of a front view of the structure of an example one-chambered constant pressure apparatus for liquid immersion cooling of servers, according to one or more embodiments.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 1 and 2). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components within immersion cooling apparatus (FIG. 1) and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

The object of the present invention is to provide a one-chambered constant pressure apparatus for liquid immersion cooling of servers. The immersion cooling apparatus has an enclosed-type condensing device with a special structural design, which comprises a plurality of condensing components having two condensing plates, which form an enclosed condensing volume. During the operation of servers, a coolant is heated to a boiling point temperature by absorbing heat dissipated from the servers and then generates a coolant vapor, which rises from a surface level of the coolant. The rising coolant vapor can be totally retained within the enclosed condensing volume formed by the two condensing plates, preventing the rising coolant vapor from passing through the condensing device and being left uncondensed. In other words, the enclosed-type condensing device can completely condense all of the rising coolant vapor, thereby maintaining the constant pressure in the apparatus and ensuring the reliability of the apparatus during operation and the sustainability of the cooling capacity thereof.

Figure 2:
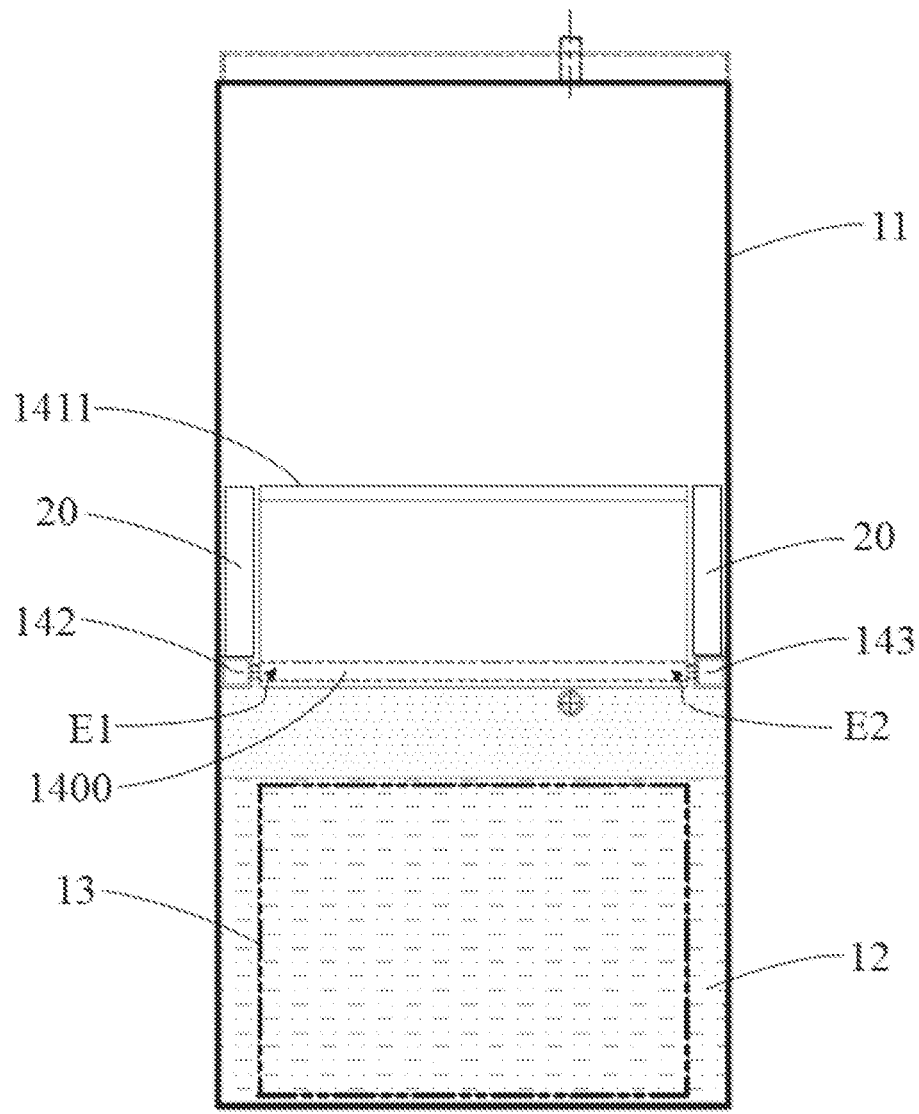
FIG. 2 is a schematic diagram of a side view of the structure of an example one-chambered constant pressure apparatus for liquid immersion cooling of servers, according to one or more embodiments.

Turning now to the figures, FIG. 1 illustrates a schematic diagram of a front view of the structure of an example one-chambered constant pressure apparatus for liquid immersion cooling of servers, and FIG. 2 illustrates a schematic diagram of a side view of the structure of an example one-chambered constant pressure apparatus for liquid immersion cooling of servers. According to one embodiment, provided is a one-chambered constant pressure immersion cooling apparatus, which comprises a chassis 11, a working fluid maintained within the chassis 11, a plurality of servers 13 submerged within the working fluid, and at least one condensing device 14.

In this embodiment, the working fluid is a coolant 12. The plurality of servers 13 are submerged within the coolant 12. Specifically, the plurality of servers 13 are completely immersed within the coolant 12; that is, the plurality of servers 13 always remain completely immersed within the coolant 12 during the process in which the coolant 12 is vaporized into a coolant vapor by absorbing heat dissipated from the plurality of servers 13 and the coolant vapor is condensed back into the coolant 12 upon contact with the condensing device 14. Moreover, the condensing device 14 is disposed right above the surface level of the coolant 12. The condensing device 14 comprises a plurality of condensing components 141, a fluid inlet manifold 142 and a fluid outlet manifold 143, wherein each of the condensing components 141 includes two condensing plates 1411, 1412. It should be noted that the two condensing plates 1411, 1412 are symmetrical and inclined against each other to be arranged in an inverted V shape above each of the servers 13. In fact, as shown in FIG. 1, each condensing component 141 is located above and in alignment with each corresponding server 13. The number of the condensing components 141 is determined depending on the number of the servers 13. In other words, the number of the condensing components 141 is the same as that of the servers 13.

Furthermore, as shown in FIG. 2, upper sections of the two condensing plates 1411, 1412 are mutually inclined closed in order to form an enclosed condensing volume. Each of the two condensing plates 1411, 1412 has a fluid passage 1400 disposed in the lower section thereof. The fluid passage 1400 has a fluid inlet port E1 and a fluid outlet port E2, wherein the fluid inlet port E1 communicates with the fluid inlet manifold 142, and the fluid outlet port E2 communicates with the fluid outlet manifold 143. A condensation fluid such as cold water is allowed to flow from the fluid inlet manifold 142 through the fluid passage 1400 via the fluid inlet port E1. The condensation fluid flowing through the fluid passage 1400 can maintain the two condensing plates 1411, 1412 at a low temperature. When the coolant 12 is heated to a boiling point temperature by absorbing heat dissipated from the servers 13 generating a coolant vapor, the coolant vapor rises from the surface level of the coolant 12. Upon contact with or exposure to the two cold condensing plates 1411, 1412 located above the surface level of the coolant 12, the rising coolant vapor is condensed into a cooling liquid, which falls back in the coolant 12 due to relative density and operation of gravity, thereby completing the vaporization-condensation cycle. Meanwhile, the condensation fluid that has absorbed heat of the coolant vapor exits from the fluid passage 1400 via the fluid outlet port E2 and then flows into the fluid outlet manifold 143.

It is understood that the coolant is a non-conductive coolant, which is known to ordinary people skilled in the art to which the present invention pertains. Using the non-conductive coolant to cool servers can simplify the sealing structure of a cooling apparatus, and can also prevent the malfunction of servers. In a preferred embodiment, the non-conductive coolant is fluoride, which has a boiling point temperature ranging between 30° C. and 60° C. With such a low boiling point, fluoride can absorb the heat dissipated from servers and reach to its boiling point temperature, resulting in vaporization of a portion of fluoride. The condensing device can condense the vapor-phase of fluoride, which can be returned to the container. Besides, all non-conductive coolants with a boiling points temperature ranging between 30° C. and 60° C. can be used as the coolants in the present invention.

It is noteworthy that conventional condensing devices of the immersion cooling apparatus are located in an open-type manner above the plurality of servers and in a direct path of rising coolant vapor created when the coolant absorbs sufficient heat from the servers to reach a boiling point temperature of the coolant. Therefore, in cases where conventional condensing devices are open-type, when many servers keep in operation at the same time for a long period, a great deal of heat will be continuously generated. After the coolant is vaporized into the coolant vapor by absorbing heat dissipated from servers, the coolant vapor rises from the surface level of the coolant and scatters in all directions, causing a portion of the rising coolant vapor to unavoidably pass through the open-type condensing devices without being condensed. The uncondensed coolant vapor gradually accumulates in the apparatus and eventually causes the pressure in the apparatus to rise, concomitantly resulting in the rise in both the boiling point of the coolant and the internal temperature of the immersion cooling apparatus.

In order to attain the aforesaid object of completely condensing all of the coolant vapor, the present invention provides a specially designed inverted V-shaped condensing component 141 that comprises two condensing plates 1411, 1412, which are mutually inclined closed to form an enclosed condensing volume. When the servers 13 start to operate, the coolant 12 is heated to a boiling point temperature by absorbing heat dissipated from the servers 13 generating the coolant vapor, which rises from the surface level of the coolant 12. The rising coolant vapor can be totally retained within a vapor volume S2 in the chassis 11. Upon contact with or exposure to the two condensing plates 1411, 1412 located above the surface level of the coolant 12, the rising coolant vapor is condensed into a cooling liquid, which falls back in the coolant 12 due to relative density and operation of gravity. Therefore, the enclosed-type condensing component 141 can prevent the rising coolant vapor from passing through the two condensing plates 1411, 1412 and completely condense all of the rising coolant vapor.

According to this embodiment, the condensing components 141 can operate independently. The two condensing plates 1411, 1412 are designed openable and closeable. Preferably, the two condensing plates 1411, 1412 rotate at an angle θ of between 40° and 50°. When the servers 13 are in operation, the two condensing plates 1411, 1412 are in a closed state so as to form an enclosed condensing volume, thereby retaining all of the coolant vapor in the vapor volume S2 for the purpose of condensation. On the other hand, when the servers 13 are to be placed into or removed from the coolant 12, the two condensing plates 1411, 1412 are in an open state so as to facilitate the manipulation of the servers 13 for the purpose of the routine maintenance. It should also be noted that an air volume S1 above the condensing device 14 is mainly reserved as the space required for the removal of the servers 13. The height of the air volume S1 is at least larger than that of the servers 13. When the servers 13 are being extracted from the coolant 12, a lot of the coolant 12 remains attached on the surface of the servers 13. Therefore, the extracted servers 13 can be held still in the air volume S1 for a few minutes to allow the attached coolant to fall from the surface of the servers 13 before the servers 13 are removed out of the chassis 11.

As mentioned above, in order to perform routine maintenance of the servers, the two condensing plates 1411, 1412 are required to stay open to extract the servers 13. However, when the two condensing plates 1411, 1412 are opened, a portion of the coolant vapor flows upward from the vapor volume S2 to the air volume S1. In case only a small amount of the coolant vapor flows upward to the air volume S1, the coolant vapor will still be retained in the lower area of the air volume S1 due to its greater specific gravity than the air, and be condensed into a cooling liquid upon contact with the condensing plates 1411, 1412. In contrast, in case many of the condensing plates 1411, 1412 are opened at the same time, a large amount of the coolant vapor flows upward to the air volume S1. Hence, in an attempt to prevent the loss of the coolant vapor, the apparatus of the present invention further provides an external condenser 18 disposed outside the chassis 11. The external condenser 18 is connected to a conduit 19. One end of the conduit 19 is disposed on the top of the chassis 11, and the other end of the conduit 19 is disposed on a side wall of the chassis 11 between the condensing device 14 and the surface level of the coolant 12. When a large amount of the coolant vapor flows upward from the vapor volume S2 to the air volume S1, the coolant vapor flowing into the conduit 19 is allowed to be condensed by the external condenser 18 into a cooling liquid, which can flow back into the chassis 11 through the conduit 19. Moreover, in order to enhance the condensing effect of the condensing device 14, a sealing unit 20 is disposed above both the fluid inlet manifold 142 and the fluid outlet manifold 143 so as to form a more closed condensing volume (as shown in FIG. 2). By doing so, the enclosed-type condensing device 14 can completely condense all of the rising coolant vapor, thereby maintaining the constant pressure in the apparatus and ensuring the reliability of the apparatus during operation and the sustainability of the cooling capacity thereof.

Based on the foregoing disclosure of technical features, the present invention has the following advantages compared with the prior art:

1. The inverted V-shaped condensing plates are designed to be mutually inclined closed, forming an enclosed condensing volume, thereby completely condensing all of the coolant vapor; and 2. The openable and closeable condensing components can operate independently. Therefore, in a process of routine maintenance of the servers, a specifically chosen condensing component can be separately opened to extract a server without affecting other condensing components.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. A one-chambered constant pressure apparatus for liquid immersion cooling of servers comprising:
   a chassis within which a working fluid is maintained;
   a plurality of servers submerged within the working fluid; and
   a condensing device disposed above a surface level of the working fluid, comprising a fluid inlet manifold, a fluid outlet manifold and the same number of openable and closeable condensing components as the servers, wherein each of the condensing components comprises two condensing plates that are symmetrical and inclined to each other, the two condensing plates are located above each of the servers, upper sections of the two condensing plates are mutually inclined closed, each of the two condensing plates has a fluid passage disposed in a lower section thereof, a fluid inlet port of the fluid passage communicates with the fluid inlet manifold, a fluid outlet port of the fluid passage communicates with the fluid outlet manifold.

2. The one-chambered constant pressure apparatus for liquid immersion cooling of servers of claim 1, wherein the working fluid is a non-conductive coolant.

3. The one-chambered constant pressure apparatus for liquid immersion cooling of servers of claim 1, wherein the working fluid has a boiling point temperature ranging from 30° C. to 60° C.

4. The one-chambered constant pressure apparatus for liquid immersion cooling of servers of claim 1, further comprising an external condenser.

5. The one-chambered constant pressure apparatus for liquid immersion cooling of servers of claim 4, wherein the external condenser is connected to a conduit, one end of the conduit is disposed on the top of the chassis, the other end of the conduit is disposed on a side wall of the chassis between the condensing device and the surface level of the working fluid.

* * * * *